US012581778B2

(12) United States Patent
Wang et al.

(10) Patent No.: US 12,581,778 B2
(45) Date of Patent: Mar. 17, 2026

(54) LIGHT EMITTING DEVICE

(71) Applicant: XIAMEN SANAN OPTOELECTRONICS CO., LTD., Xiamen (CN)

(72) Inventors: Qing Wang, Xiamen (CN); Quanyang Ma, Xiamen (CN); Jiangbin Zeng, Xiamen (CN); Dazhong Chen, Xiamen (CN); Ling-Yuan Hong, Xiamen (CN); Kang-Wei Peng, Xiamen (CN); Su-Hui Lin, Xiamen (CN)

(73) Assignee: XIAMEN SANAN OPTOELECTRONICS CO., LTD., Xiamen (CN)

( * ) Notice: Subject to any disclaimer, the term of this patent is extended or adjusted under 35 U.S.C. 154(b) by 749 days.

(21) Appl. No.: 17/955,964

(22) Filed: Sep. 29, 2022

(65) Prior Publication Data

US 2023/0024758 A1     Jan. 26, 2023

Related U.S. Application Data

(63) Continuation-in-part of application No. PCT/CN2020/082131, filed on Mar. 30, 2020.

(51) Int. Cl.
*H10H 20/841*     (2025.01)
*H01L 25/075*     (2006.01)
*H10H 20/851*     (2025.01)

(52) U.S. Cl.
CPC ....... *H10H 20/841* (2025.01); *H01L 25/0756* (2013.01); *H10H 20/8512* (2025.01)

(58) Field of Classification Search
CPC .......................... H10H 20/841; H10H 20/8512
See application file for complete search history.

(56) References Cited

U.S. PATENT DOCUMENTS

| | | | | |
|---|---|---|---|---|
| 2016/0087159 A1* | 3/2016 | Kim | ..................... | H10H 20/841 257/98 |
| 2019/0067526 A1* | 2/2019 | Kim | ..................... | H10H 20/841 |
| 2019/0371967 A1* | 12/2019 | Kim | ..................... | H10H 20/825 |

FOREIGN PATENT DOCUMENTS

| | | |
|---|---|---|
| CN | 205319184 U | 6/2016 |
| CN | 106887498 A | 6/2017 |
| CN | 209981278 U | 1/2020 |

OTHER PUBLICATIONS

Search Report issued to PCT application No. PCT/CN2020/082131 on Dec. 28, 2020.

* cited by examiner

*Primary Examiner* — Mark W Tornow
(74) *Attorney, Agent, or Firm* — MUNCY, GEISSLER, OLDS & LOWE, P.C.

(57)     ABSTRACT

A light-emitting device includes a semiconductor light-emitting stack and a distributed Bragg reflector (DBR) structure. The semiconductor light-emitting stack includes a light-emitting layer. The DBR structure is disposed on the semiconductor light-emitting stack and includes a plurality of first dielectric material layers and a plurality of second dielectric material layers that are alternately stacked on the semiconductor light-emitting stack. The first dielectric material layer has a first refractive index, and the second dielectric material layer has a second refractive index. The first refractive index is lower than the second refractive index. The second dielectric material layer has an optical thickness that is smaller than that of the first dielectric material layer.

20 Claims, 12 Drawing Sheets

450 nm peak wavelength, 30° incident angle 450 nm peak wavelength, 40° incident angle

LIGHT EMITTING DEVICE

CROSS-REFERENCE TO RELATED APPLICATION

This application is a bypass continuation-in-part (CIP) application of PCT International Application No. PCT/CN2020/082131 filed on Mar. 30, 2020. The entire content of the international patent application is incorporated herein by reference.

FIELD

The disclosure relates to a semiconductor light-emitting device, and more particularly to a light-emitting device that includes a distributed Bragg reflector (DBR) structure.

BACKGROUND

A gallium nitride (GaN)-based semiconductor light-emitting diode (LED) has a wide application. The GaN-based semiconductor LED that emits light having a mixed color (e.g., a visible light) has been commonly applied in daily life, such as backlight units and lighting devices.

In order to enhance a luminous efficiency of the GaN-based semiconductor LED, conventional techniques are to roughen the light emitting surface of the GaN-based semiconductor LED, to adjust the shape of a light-transmissive substrate of or a semiconductor epitaxial stack of the LED, or to dispose a metal reflection layer or a distributed Bragg reflector (DBR) structure on a chip mounting site opposite to a light-emitting mesa of the LED, so as to reflect light emitted from the light-emitting mesa toward the chip mounting site.

Compared with the metal reflection layer, the DBR structure that is made of silicon oxide or aluminum oxide has a high reflectance and a stable chemical property, so that the DBR structure does not have problems of reflectance attenuation caused by metal migration or oxidation after long-term use. In addition, the DBR structure has a high reflection capability.

In order to ensure that a DBR structure has high reflectance for light emitted from a light-emitting layer to the surface of and an inside of the DBR structure of a GaN-based semiconductor LED, such as a blue light or green light chip), an existing DBR structure is formed by stacking at least two film stacks. Particularly, the existing DBR structure includes one film stack having multiple film layers each having an optical thickness that is smaller than 0.25 times a center wavelength of light emitted from the light-emitting layer, and another film stack each film layer of which has an optical thickness that is greater than 0.25 times a center wavelength of light emitted from the light-emitting layer, wherein the center wavelength is a center wavelength of a white light range, which is calculated to be 550 nm. However, the abovementioned DBR structure has shortcomings as follows: Firstly, because the DBR structure has titanium oxide films and silicon oxide films, and the titanium oxide film has a refractive index greater than that of the silicon oxide film and because the titanium oxide film has a thickness greater than that of the silicon oxide film and thus has a light absorbance greater than that of the silicon oxide film, the light absorbance of the DBR structure is high. Secondly, when the light-transmissive substrate is a sapphire substrate and when the semiconductor epitaxial stack made of GaN-based material is formed on an upper surface of the light-transmissive substrate and the DBR structure is disposed on a lower surface of the light-transmissive substrate, light emitted from the light-emitting layer passes through the light-transmissive substrate and reaches the DBR structure. In such case, light emitted from the light-emitting layer is incident into the DBR structure not only at an incident angle of 0° (i.e., an included angle between the incident light and the stacking direction is 0°, that is to say, the incident light is perpendicular to the DBR structure), but also at an angle deviating from 0°. Especially, when the light-transmissive substrate is a patterned sapphire substrate (PSS), light emitted from the light-emitting layer may be scattered by a pattern on an upper surface of the PSS, and thus increase the incident angle of light incident on a lower surface of the PSS. In such patterned substrate, light is scattered by sidewalls of cone-shaped patterned elements on the upper surface of the PSS, thereby increasing an amount of light incident on the lower surface of the PSS at incident angles greater than 0°. Because of an increased amount of light that reaches the lower surface of the PSS at the incident angle greater than 0°, the DBR structure should be designed by considering its reflection capability for light not only incident at 0° but also at incident angles greater than 0°. However, due to a poor reflectance of the existing DBR structure with respect to light having the incident angle greater than 0°, an overall reflectance of the existing GaN-based semiconductor LED is low.

SUMMARY

Therefore, an object of the disclosure is to provide a light-emitting device that can alleviate at least one of the drawbacks of the prior art.

According to a first aspect of the disclosure, a light-emitting device includes a semiconductor light-emitting stack and a distributed Bragg reflector (DBR) structure.

The semiconductor light-emitting stack includes a light-emitting layer. The DBR structure is disposed on the semiconductor light-emitting stack and includes a plurality of first dielectric material layers and a plurality of second dielectric material layers that are alternately stacked on the semiconductor light-emitting stack. The first dielectric material layer has a first refractive index, and the second dielectric material layer has a second refractive index. The first refractive index is lower than the second refractive index. The second dielectric material layer has an optical thickness that is smaller than that of the first dielectric material layer.

According to a second aspect of the disclosure, a light-emitting apparatus includes the light-emitting device as mentioned above.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
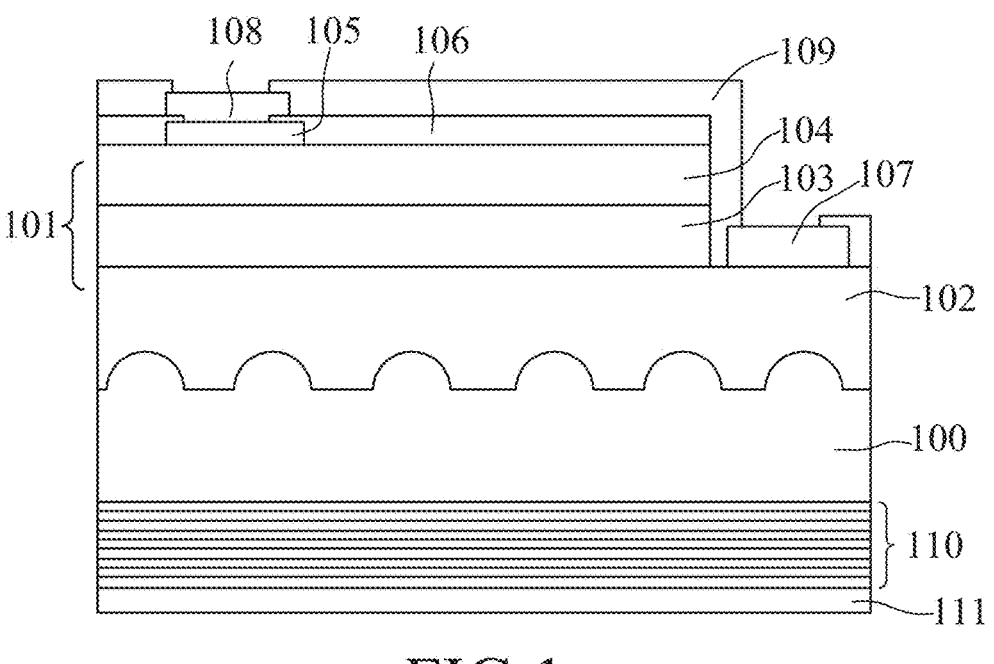
FIG. 1 is a schematic view illustrating a first embodiment of a light-emitting device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, a first embodiment of a light-emitting device according to the present disclosure includes a light-transmissive substrate 100, a semiconductor light-emitting stack 101, and a distributed Bragg reflector (DBR) structure 110.

The light-transmissive substrate 100 is disposed between the semiconductor light-emitting stack 101 and the DBR structure 110. The light-transmissive substrate 100 may be one of a sapphire substrate and a gallium nitride (GaN)-based substrate. The light-transmissive substrate 100 may have a patterned surface, such as patterned sapphire substrate (PSS). The light-transmissive substrate 100 can be used for growing thereon the semiconductor light-emitting stack 101 that is made of GaN-based material, and can also be used to support the semiconductor light-emitting stack 101 through a bonding process.

The semiconductor light-emitting stack 101 is disposed on an upper surface of the light-transmissive substrate 100, and includes a first conductivity type semiconductor layer 102, a second conductivity type semiconductor layer 104 and a light-emitting layer 103 disposed between the first conductivity type semiconductor layer 102 and the second conductivity type semiconductor layer 104. The first conductivity type semiconductor layer 102 has a conductivity type opposite to that of the second conductivity type semiconductor layer 104. For example, the conductivity type of the first conductivity type semiconductor layer 102 may be n-type and the conductivity type of the second conductivity type semiconductor layer 104 may be p-type, or vice versa.

Each of the first conductivity type semiconductor layer 102, the light-emitting layer 103, and the second conductivity type semiconductor layer 104 may be made of GaN-based semiconductor material, such as aluminum nitride, indium nitride, or GaN. The light-emitting layer 103 can emit light having a predetermined wavelength, such as ultraviolet light, blue light or green light. The first conductivity type semiconductor layer 102 and/or the second conductivity type semiconductor layer 104 may be a single layer structure or a multilayered structure. The light-emitting layer 103 may be a single quantum well structure and a multiple quantum well structure. In certain embodiments, the light-emitting device may further include a buffer layer disposed between the light-transmissive substrate 100 and the first conductivity type semiconductor layer 102, thereby increasing an adhesion of the semiconductor light-emitting stack 101 on the light-transmissive substrate 100.

Each of the first conductivity type semiconductor layer 102, the second conductivity type semiconductor layer 104 and the light-emitting layer 103 may be formed by metal-organic chemical vapor deposition (MOCVD) or molecular beam epitaxy (MBE). In addition, the second conductivity type semiconductor layer 104 and the light-emitting layer 103 may be partially etched to expose a part of an upper surface of the first conductivity type semiconductor layer 102.

The light-emitting device may further include a current blocking layer 105, a transparent conducting layer 106, a first electrode 107, and a second electrode 108. The light-emitting device may be a lateral-type light-emitting device. The current blocking layer 105 is disposed on the second conductivity type semiconductor layer 104 opposite to the light-emitting layer 103. The shape and location of each of the transparent conducting layer 106, the first electrode 107, and the second electrode 108 can be designed to adapt the lateral-type light-emitting device.

In this embodiment, the transparent conducting layer 106 may be formed on the second conductivity type semiconductor layer 104 opposite to the light-emitting layer 103. The transparent conducting layer 106 may be made of indium tin oxide (ITO) or nickel/gold (Ni/Au). The transparent conducting layer 106 may have a resistivity lower than that of the second conductivity type semiconductor layer 104, and is used to laterally spread a current. The first electrode 107 (e.g., an n-type electrode) is formed on the first conductivity type semiconductor layer 102 (e.g., n-type semiconductor layer) opposite to the light-transmissive substrate 100, and the second electrode 108 (e.g., a p-type electrode) is formed on the transparent conducting layer 106 opposite to the second conductivity type semiconductor layer 104. The second electrode 108 may be electrically connected to the second conductivity type semiconductor layer 104 through the transparent conducting layer 106.

The DBR structure 110 is disposed on a lower surface of the light-transmissive substrate 100. In this embodiment, the light-emitting device has a main light exiting surface that is located on a side of the semiconductor light-emitting stack 101 that is distal from the light-transmissive substrate 100, and light emitted from the light-emitting layer 103 is reflected by the DBR structure 110 and transmits in a direction away from the light-transmissive substrate 100.

The DBR structure 110 includes a plurality of first dielectric material layers and a plurality of second dielectric material layers that are alternately stacked on the light-transmissive substrate 100. The first dielectric material layer has a first refractive index, the second dielectric material layer has a second refractive index, and the first refractive index is lower than the second refractive index.

The first dielectric material layer may be made of silicon oxide, and the second dielectric material layer may be made of titanium oxide. The first dielectric material layer may have a refractive index of 1.47 (measured at a wavelength of 550 nm), and the second dielectric material layer may have a refractive index of 2.43 (measured at a wavelength of 550 nm). The first and second dielectric material layers (i.e, insulating layers), which are respectively made of silicon oxide and titanium oxide, have inherent characteristics, such as easy for deposition, and can exhibit a relatively large difference between the refractive indices thereof. However, it can be understood that there are no particular limitations on materials for forming each of the first dielectric material layer and the second dielectric material layer.

The second dielectric material layer has an optical thickness that is smaller than that of the first dielectric material layer, and the refractive index of the second dielectric material layer is greater than that of the first dielectric material layer. The second dielectric material layer has a light absorbance greater than that of the first dielectric material layer. In this embodiment, the optical thickness of the second dielectric material layer is reduced to significantly lower a light absorbance of the DBR structure 110. On the other hand, the optical thickness of all of the first dielectric material layers is greater than that of the second dielectric material layers. The DBR structure 110 thus has a high reflectance with respect to light that has a wavelength ranging from 380 nm to 550 nm and that is incident not only at small incident angles but also large incident angles (e.g., ranging from 40° to 50°).

The optical thickness of each of the first dielectric material layer and the second dielectric material layer is obtained by multiplying a geometric thickness thereof by a refractive index thereof. The refractive index is a value theoretically calculated or measured at a wavelength of 550 nm.

Figure 2:
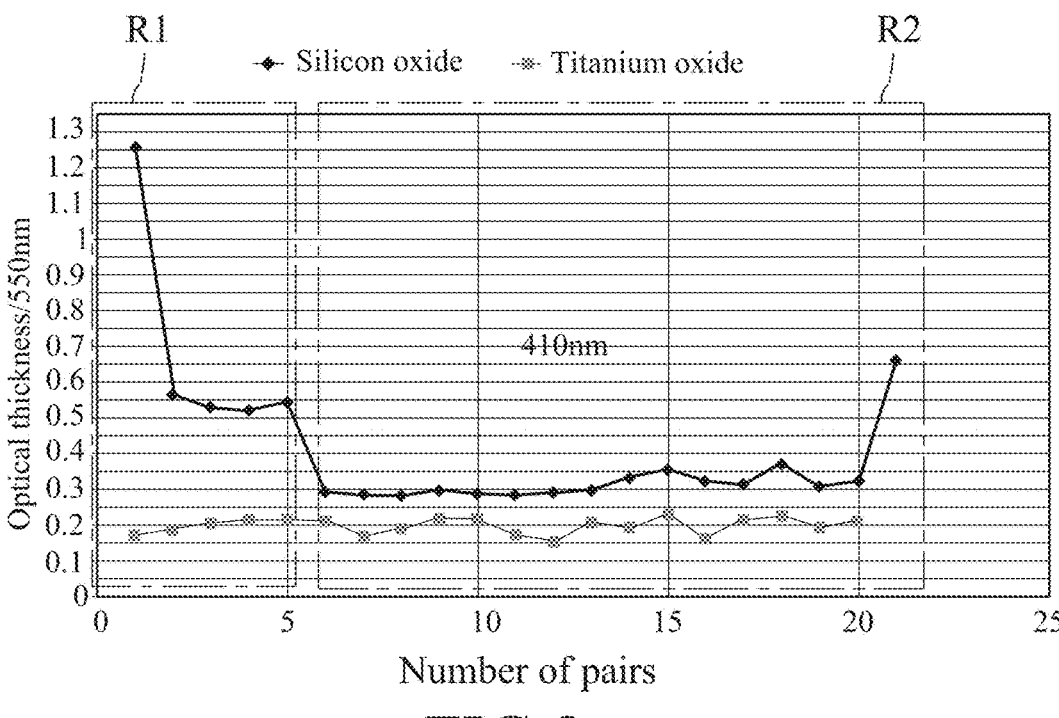
FIGS. 2 to 4 are graphical diagrams respectively showing a relationship between optical thicknesses/550 nm and the number of pairs of first dielectric material layers and second dielectric material layers used in distributed Bragg reflector (DBR) structures of three exemplary light-emitting devices of the first embodiment, which emit light respectively at peak wavelengths of 410 nm, 450 nm and 520 nm.
Figure 3:
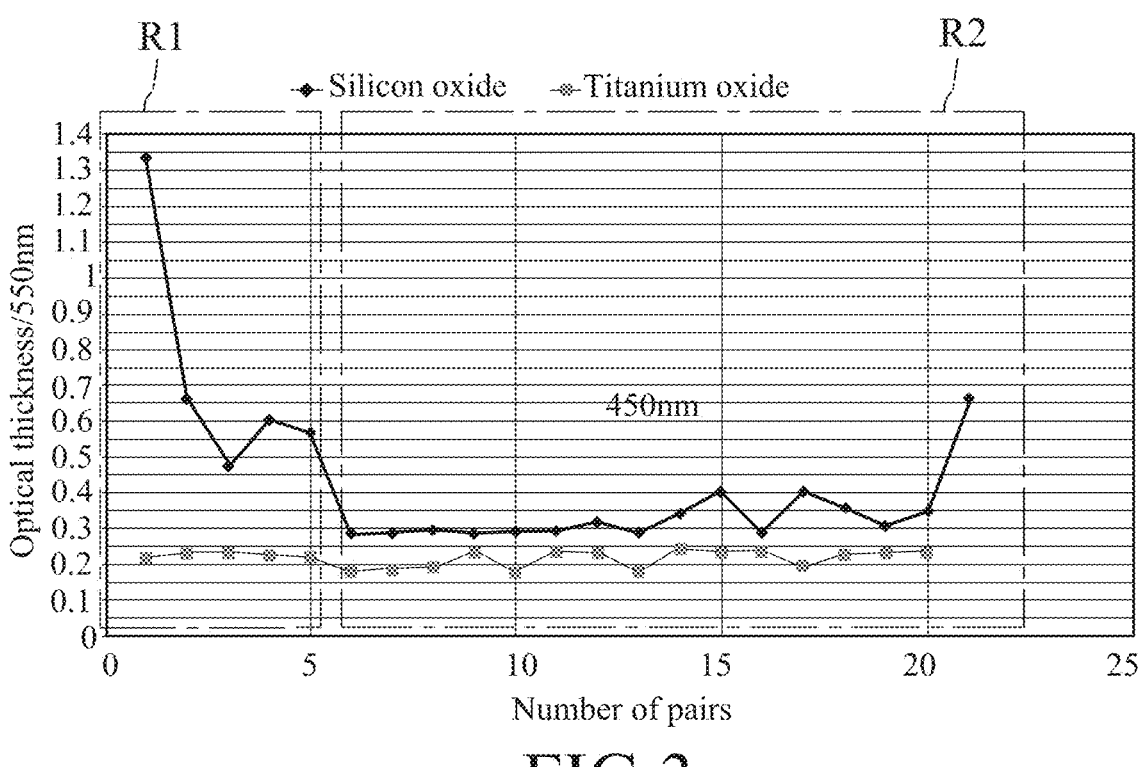
Figure 4:
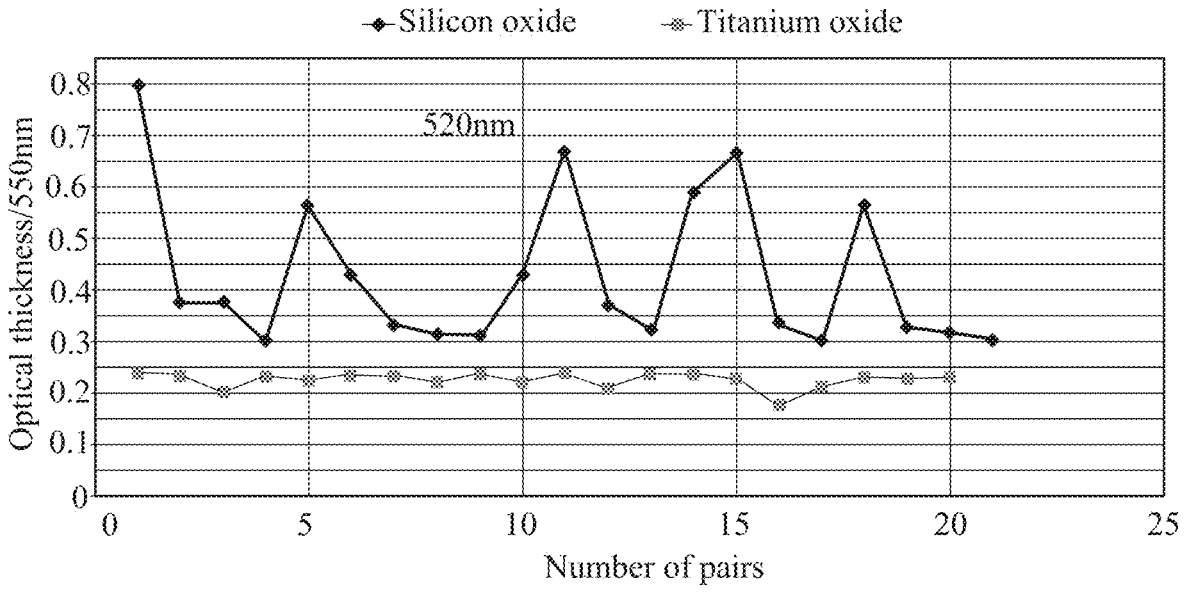
Figure 5A:
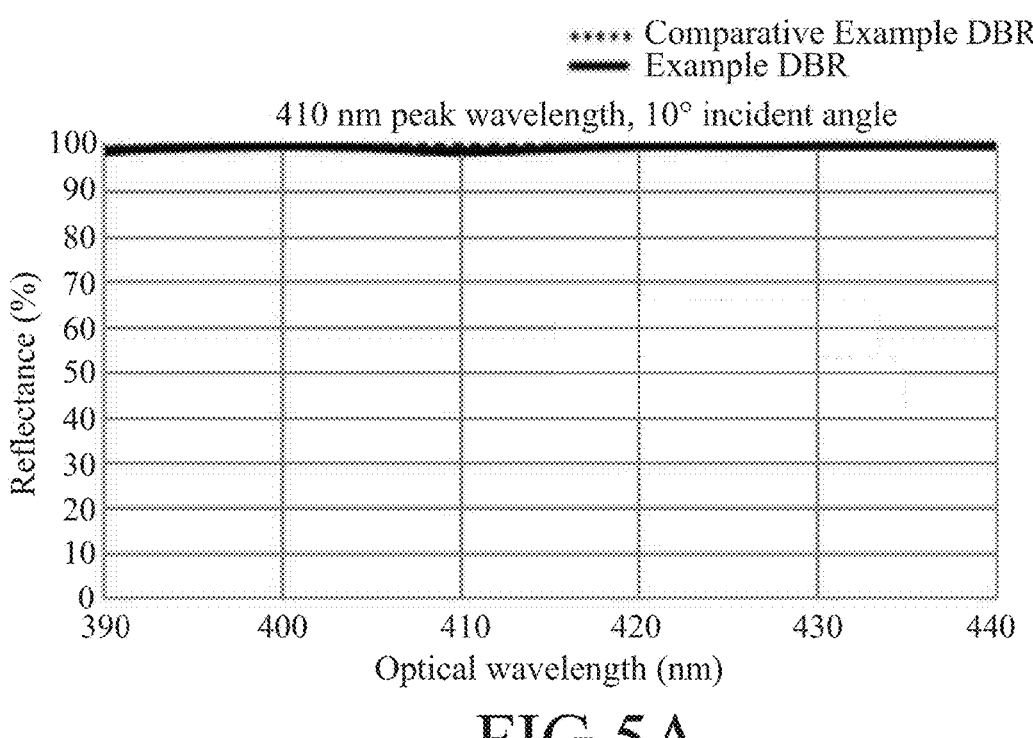
FIGS. 5A-5E, 6A-6E and 7A-7E are graphical diagrams respectively showing the results of simulation of reflectance values of the DBR structures of the three exemplary light-emitting devices of the first embodiment.
Figure 5B:
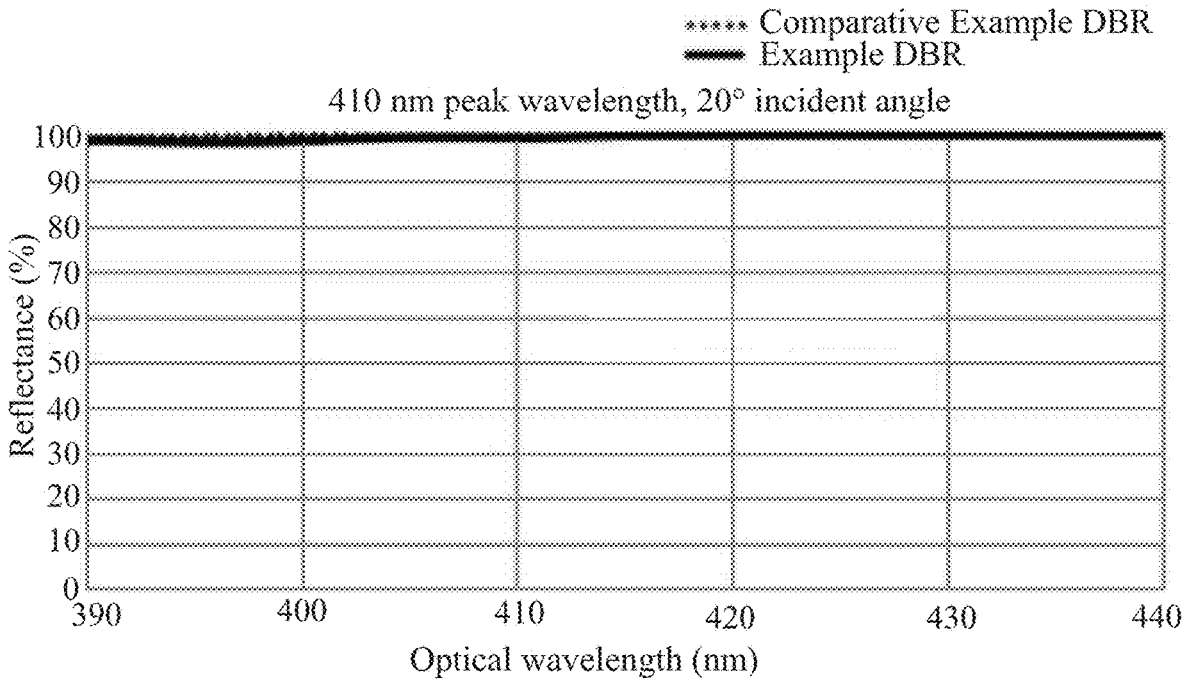
Figure 5C:
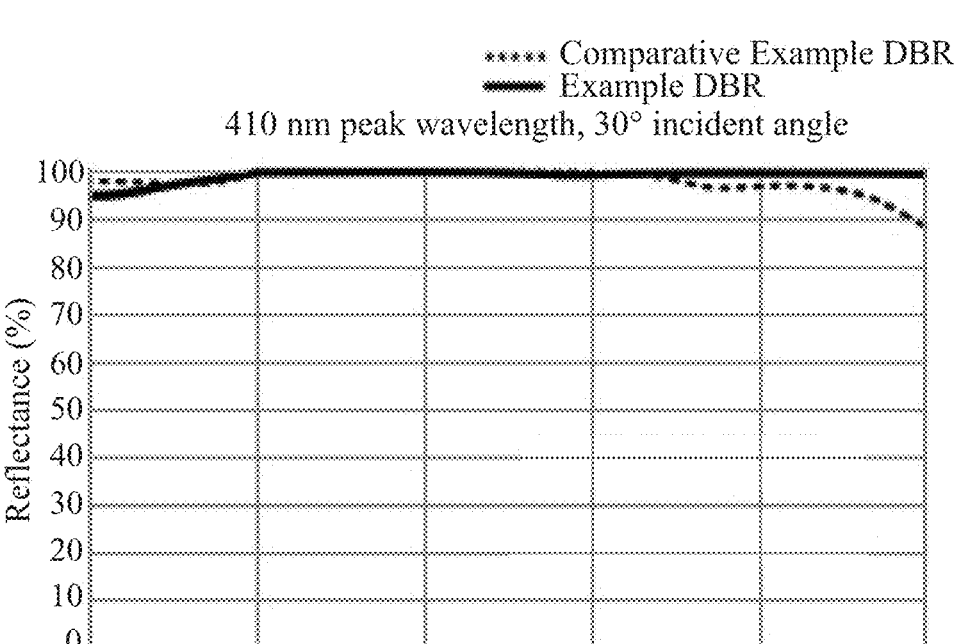
Figure 5D:
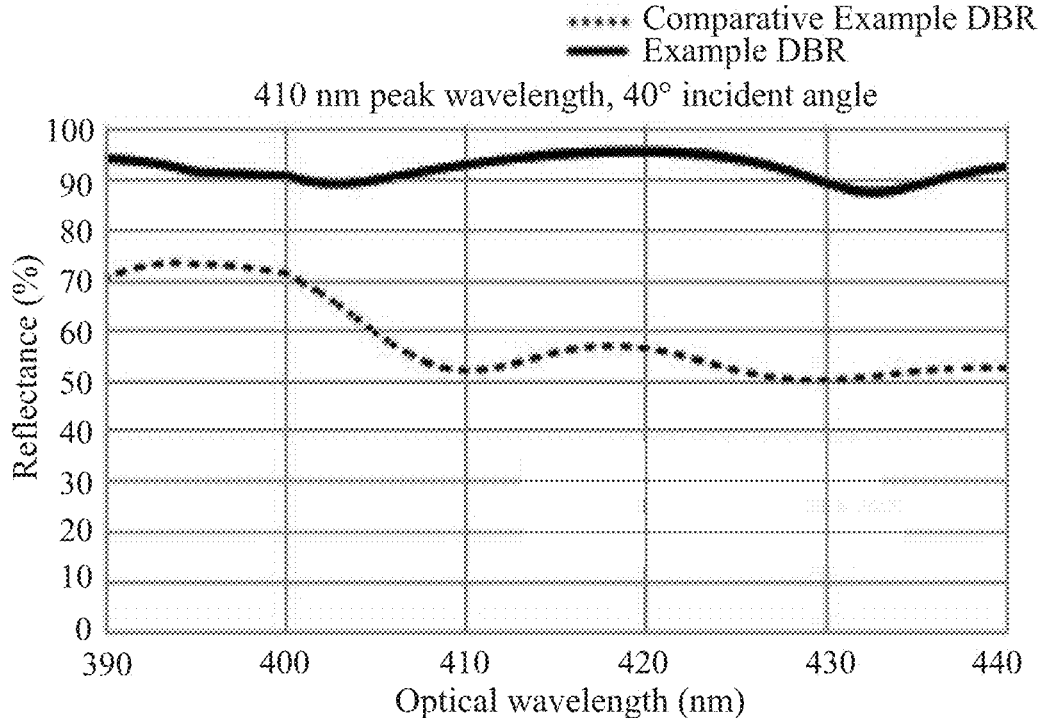
Figure 5E:
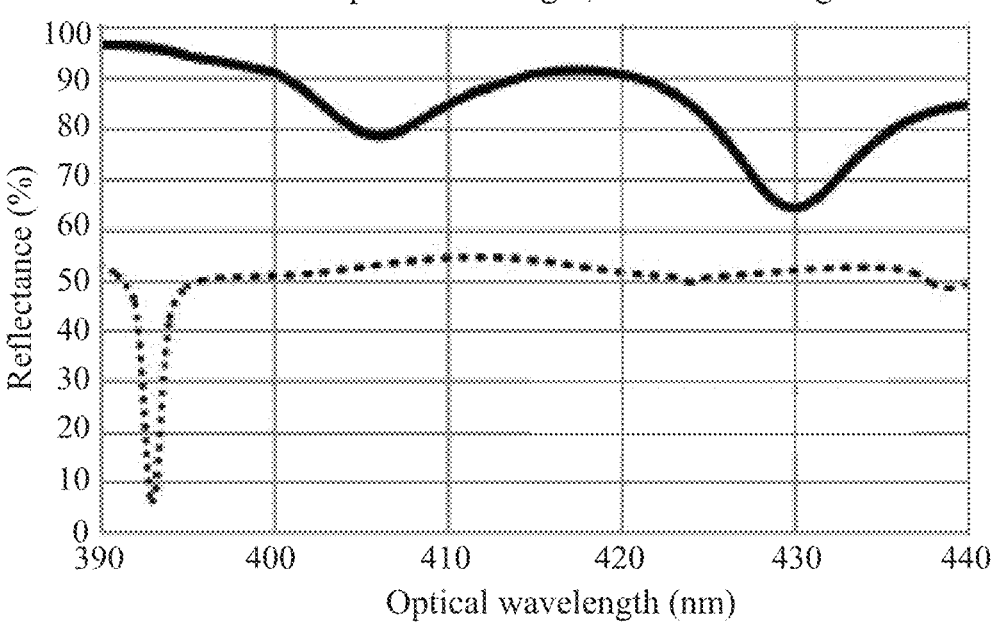
Figure 6A:
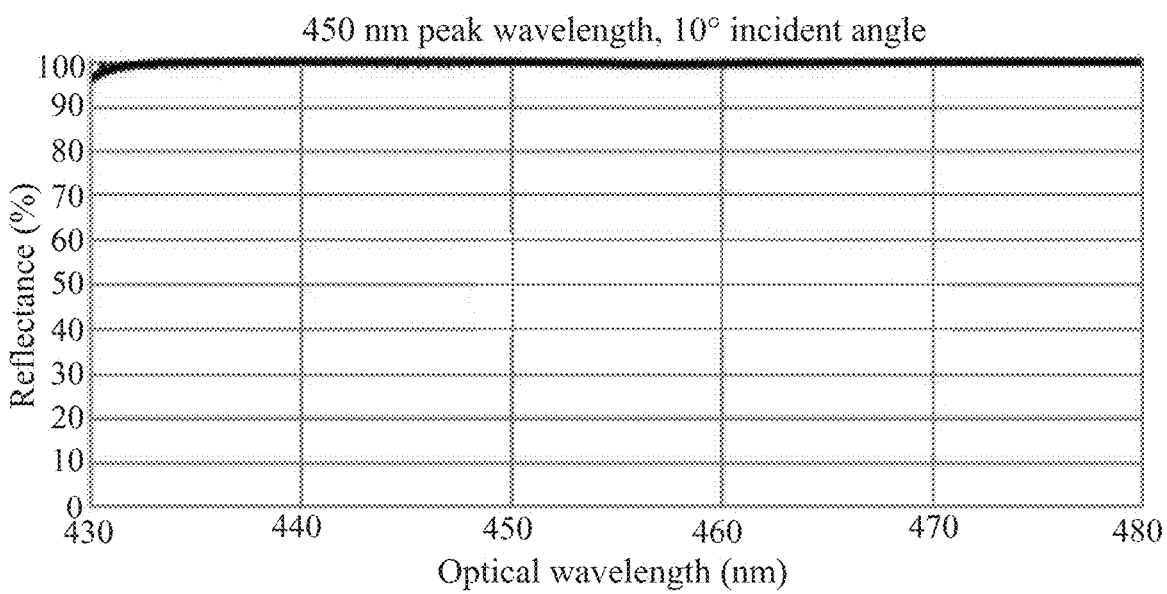
Figure 6B:
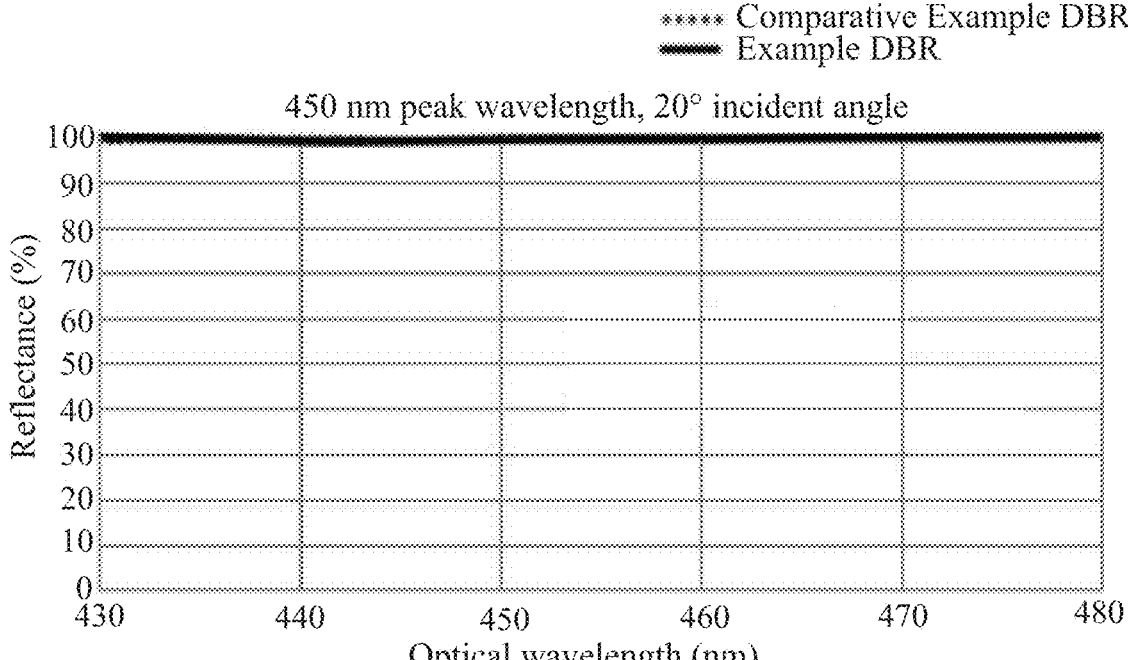
Figure 6C:
Figure 6C:
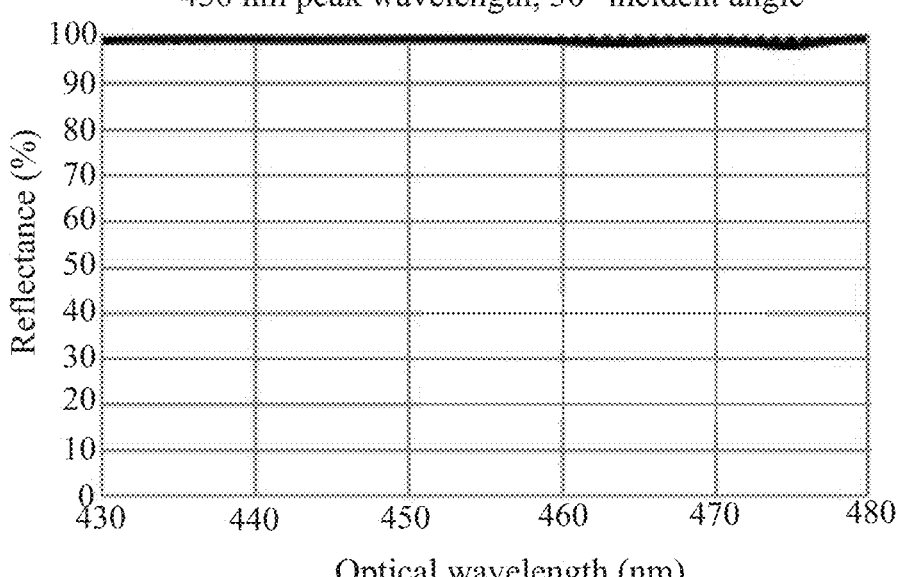
Figure 6D:
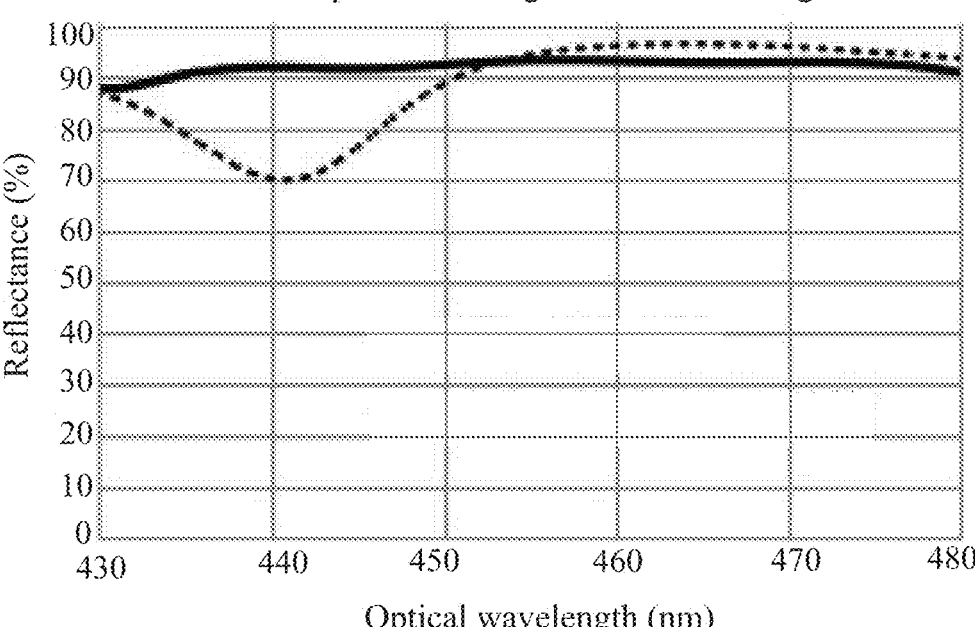
Figure 6E:
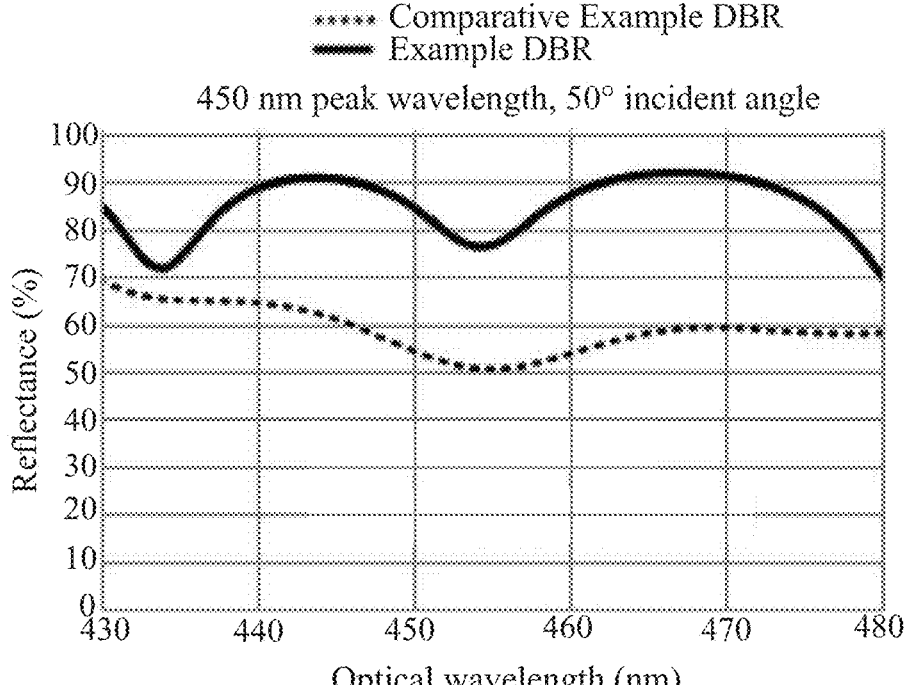
Figure 7A:
Figure 7A:
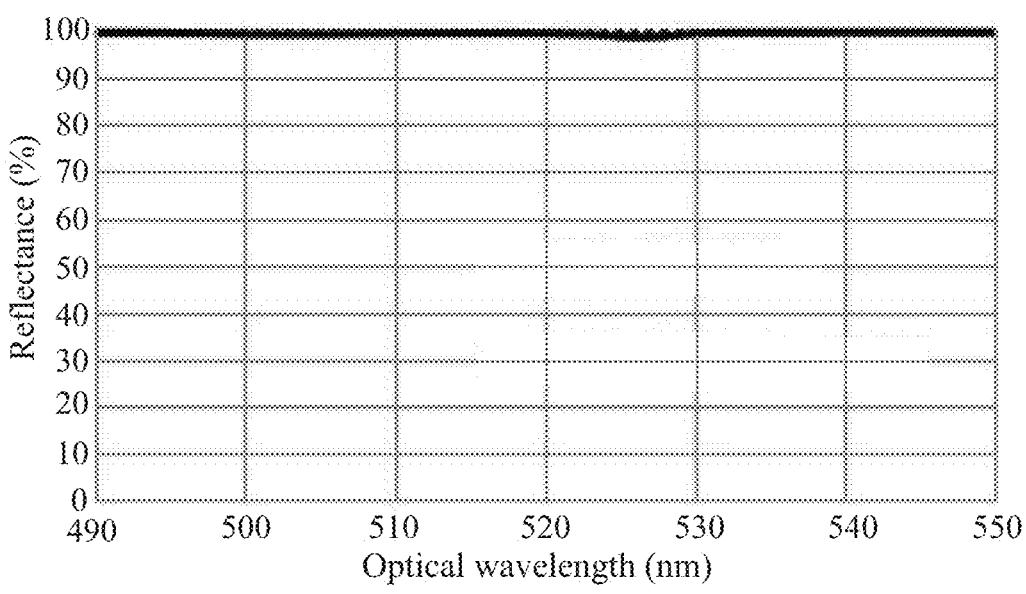
Figure 7B:
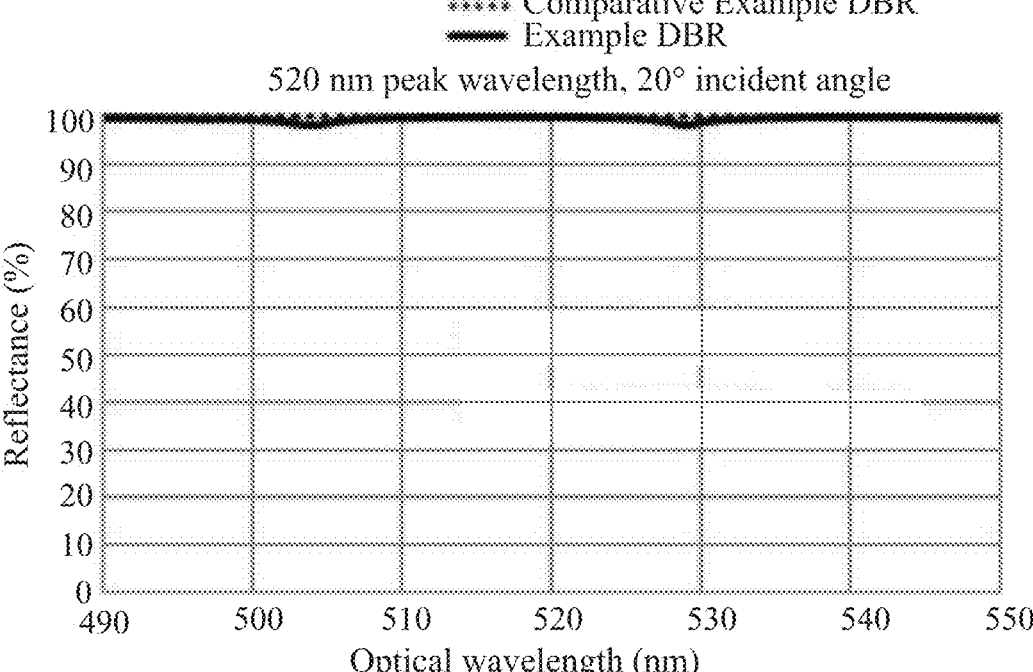
Figure 7C:
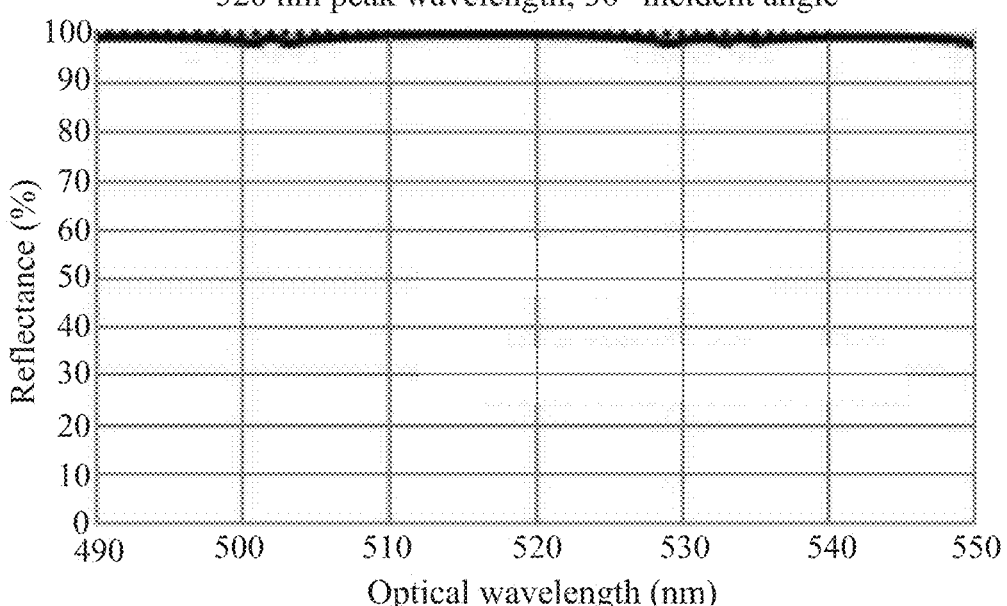
Figure 7D:
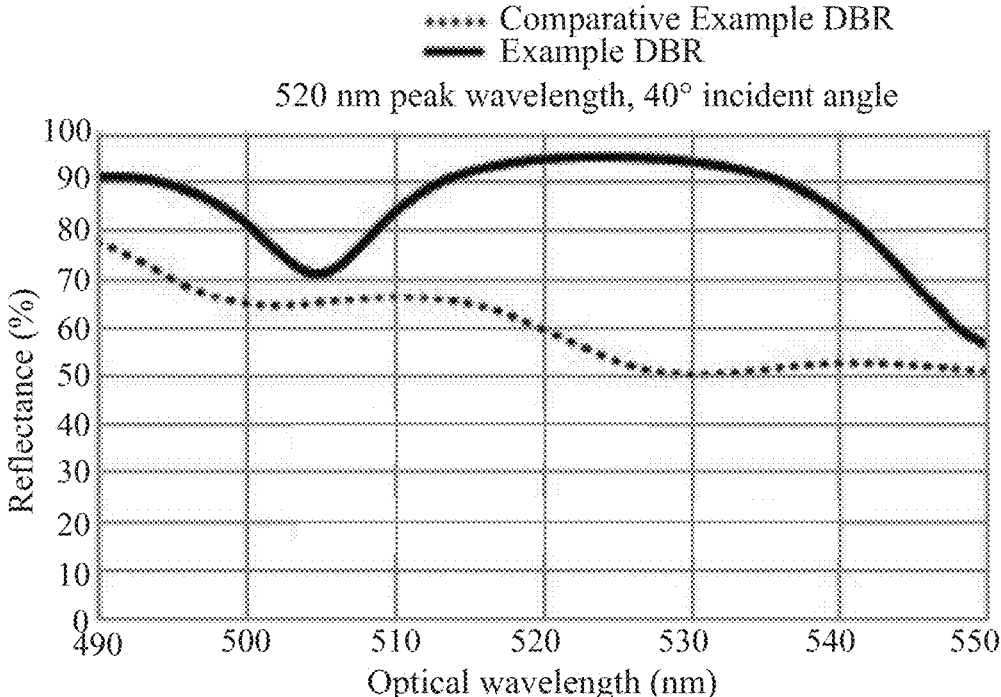
Figure 7E:
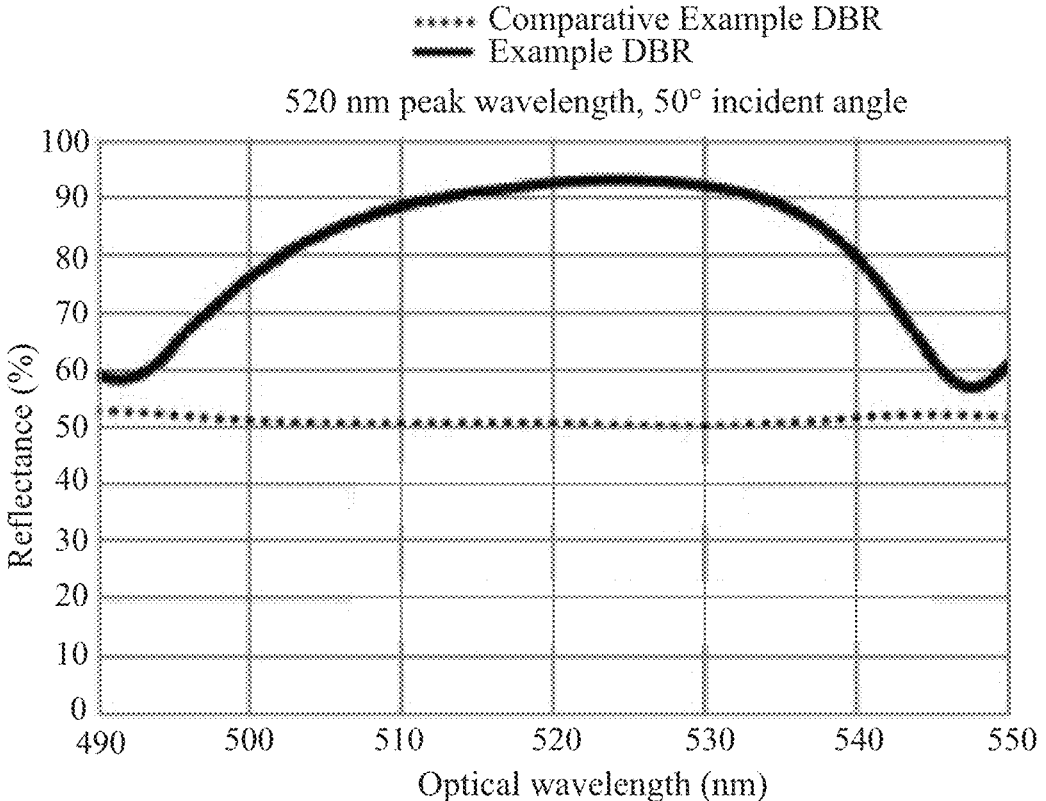

FIGS. 2 to 4 illustrate graphical diagrams relating to three examples of the light-emitting devices of the first embodiment, in which the DBR structures 110 are used to respectively reflect ultraviolet light having a peak wavelength of 410 nm, blue light having a peak wavelength of 450 nm and green light having a peak wavelength of 520 nm; each graphical diagram represents the optical thickness and the number of pairs of the first and second dielectric material layers in the DBR structure 110. In the DBR structure 110 of each example, the number of the first dielectric material layers is 21; the number of the second dielectric material layers is 20; and the total thereof is 41. The first dielectric material layers and the second dielectric material layers are alternately stacked in a direction away from the light-transmissive substrate 100.

In order to reduce the light absorbance of the DBR structure 110, the optical thickness of each of the second dielectric material layers is not larger than $0.25\lambda$ and $\lambda$ is equal to 550 nm. In certain embodiments, at least two of the second dielectric material layers each has an optical thickness smaller than $0.25\lambda$. In other embodiments, at least a half of the amount of the second dielectric material layers each has an optical thickness smaller than $0.25\lambda$. In still other embodiments, the optical thickness of each of the second dielectric material layers is smaller than $0.25\lambda$.

When the optical thickness of each of the second dielectric material layers is not larger than $0.25\lambda$ and $\lambda$ is equal to 550 nm, the optical thickness of each of the first dielectric material layers is not smaller than $0.25\lambda$, and the DBR structure 110 might have a high reflectance with respect to light having a large incident angle ranging from 40° to 50°. In certain embodiments, the optical thickness of each of at least two of the first dielectric material layers may be greater than $0.25\lambda$. In other embodiments, the optical thickness of each of at least a half of the amount of the first dielectric material layers may be greater than $0.25\lambda$. In still other embodiments, the optical thickness of each of the first dielectric material layers may be greater than $0.25\lambda$. In still other embodiments, the optical thickness of each of the first dielectric material layers may not be larger than $3\lambda$. It is noted that increasing further the optical thickness of the second dielectric material layer from $0.25\lambda$ is unnecessary, and may impose a serious light absorption problem on the DBR structure 110. In certain embodiments, the optical thickness of each of the first dielectric material layers may range from $0.25\lambda$ to $1.5\lambda$.

The optical thickness of each of the second dielectric material layers should not be smaller than $0.04\lambda$. During a process for manufacturing the DBR structure 110, the optical thickness of the second dielectric material layer smaller than $0.04\lambda$ is difficult to be precisely controlled and obtained, and thus can affect the reflectance of the DBR structure 110.

The DBR structure 110 may include 5 to 35 pairs of the first and second dielectric material layers that are alternately stacked on each other.

In certain embodiments, an overall standard deviation value of the optical thickness of the first dielectric material layers is greater than that of the optical thickness of the second dielectric material layers. The greater overall standard deviation value of the first dielectric material layers is conducive for enhancing the reflectance of the DBR structure 110 with respect to light having the large incident angle.

In the examples represented by the graphs shown in FIGS. 2 and 3, the peak wavelengths of light (ultraviolet light and blue light) emitted by the semiconductor light-emitting stacks 101 fall within a wavelength range between 380 nm to 480 nm. Each DBR structure 110 of the examples includes a first region R1 and a second region R2 that is more distal from the semiconductor light-emitting stack 101 than the first region R1, wherein an average optical thickness of the first dielectric material layers located in the first region R1 is greater than that of the first dielectric material layers located in the second region R2. By having the average optical thickness of the first dielectric material layers located in the first region R1 being greater than that of the first dielectric material layers located in the second region R2, the reflectance of the DBR structure 110 with respect to the short wavelength light between 380 nm to 480 nm can be enhanced. The first region R1 has a $1^{st}$ one of the first dielectric material layers nearest to the semiconductor light-emitting stack 101 to an $n^{th}$ one of the first dielectric material layers, and the second region R2 has the remaining first dielectric material layers succeeding the $n^{th}$ one of the first dielectric material layers. In this embodiment, the optical thickness of each of the first dielectric material layers located in the first region (e.g., the $1^{st}$ to $5^{th}$ first dielectric material layers) may range from $0.4\lambda$ to $3\lambda$, the optical thickness of each of the first dielectric material layers located in the second region (e.g., the $6^{th}$ to $21^{st}$ first dielectric material layers) may range from $0.25\lambda$ to $\lambda$, and the number of the first dielectric material layers located in the second region R2 is larger than that of the second dielectric material layers located in the second region R2. In the first region R1, the optical thickness of each of the first dielectric material layers (e.g., the $1^{st}$ to $5^{th}$ first dielectric material layers) may range from $0.4\lambda$ to $\lambda$, except for the $1^{st}$ first dielectric material layer. In the second region R2, the optical thickness of each of the first dielectric material layers (e.g., the $6^{th}$ to $21^{st}$ first dielectric material layers) may range from $0.25\lambda$ to $0.5\lambda$, except for the $21^{st}$ first dielectric material layer.

In the example represented by the graph shown in FIG. 4, the semiconductor light-emitting stack 101 emits light having a peak wavelength within a range between 490 nm and 550 nm, and the optical thickness of each of the second dielectric material layers ranges from $0.04\lambda$ to $0.25\lambda$.

In addition, the DBR structure 110 has a first layer that is nearest to the semiconductor light-emitting stack 101 or the light-transmissive substrate 100 and that is one of the first dielectric material layers; the optical thickness of the first layer is greater than that of the other first dielectric material layers, and the refractive index of the first layer is lower than that of the other first dielectric material layers. This arrangement can increase the reflectance of the DBR structure 110. The DBR structure 110 further has the last layer that is farthest from the semiconductor light-emitting stack 101 or the light-transmissive substrate 100; the last layer may be the first or second dielectric material layer; and there is no limitation for the last layer. In the examples represented by the graphs shown in FIGS. 2 and 3, the last layer may be the first dielectric material layer and has a relatively greater optical thickness, such as greater than 0.5λ. The optical thickness of the last layer is lower than that of the first layer which is the first dielectric material layer.

The disclosure will be further described by way of the following examples. However, it should be understood that the following examples are solely intended for the purpose of illustration and should not be construed as limiting the disclosure in practice.

EXAMPLES AND COMPARATIVE EXAMPLES

FIGS. 5A to 7E show the results of simulation of reflectance values for three DBR structures 110 respectively disposed in the above three examples of the first embodiment, which emit light respectively at peak wavelengths of 410 nm, 450 nm and 520 nm, and in wavelength ranges between 390 nm and 440 nm, between 430 nm and 480 nm, and between 490 nm and 550 nm. FIGS. 5A to 7E also show the results of simulation of reflectance values for three conventional DBR structures respectively disposed in three comparative examples, which also emit light with peak wavelengths at 410 nm, 450 nm and at 520 nm, respectively. The DBR structure of each of comparative examples includes at least two film stacks that are stacked on each other. Specifically, the DBR structure of each comparative example includes a first film stack, in which an optical thickness of each film is smaller than 0.25 times a center wavelength (i.e., 550 nm), and a second film stack, in which each film has an optical thickness greater than 0.25 times the center wavelength. Each of the two film stacks includes two films with different refractive indices, SiOx and TiOx. As shown in FIGS. 5A to 7E, the reflectance values of the three DBR structures 110 of the examples are at least above 90% for all light beams at peak wavelengths of 410 nm, 450 nm and 520 nm, with incident angles ranging from 10° to 40°, and the reflectance values thereof are at least above 80% for all light beams at peak wavelengths of 410 nm, 450 nm and 520 nm, with an incident angle of 50°. In addition, with respect to light having the incident angle ranging from 40° to 50°, the reflectance values of the DBR structures 110 of the examples are all greater than that of the DBR structures of comparative examples. Therefore, by having the optical thickness of the first dielectric material layers being greater than that of the second dielectric material layers having higher refractive indices, light absorption problems of the DBR structure 110 caused by the higher refractive index second dielectric material layers can be alleviated, and the reflectance of the DBR structure 110 for light beams that have wavelengths ranging from 380 nm to 550 nm and that are incident at either small or large angles can be enhanced.

In this embodiment, the light-emitting device may further include a metal reflection layer 111 that is disposed on the DBR structure 110 opposite to the light-transmissive substrate 100. A combination of the DBR structure 110 and the metal reflection layer 111 can increase reflection of light emitted from the light-emitting layer 103. In addition, the metal reflection layer 111 can enhance dissipation of heat generated from the light-emitting device.

In this embodiment, the light-emitting device may further include a protective layer 109 that is used to cover and protect the light-emitting layer 103, the second conductivity type semiconductor layer 104, the transparent conducting layer 106, the first electrode 107, and the second electrode 108 from being affected by water vapor.

In certain embodiments, the DBR structure 110 may be formed on the lower surface of the light-transmissive substrate 100 by ion beam assisted deposition (IBAD).

By having the DBR structure 110, a luminous efficiency of the light-emitting device can be efficiently enhanced.

Figure 8:
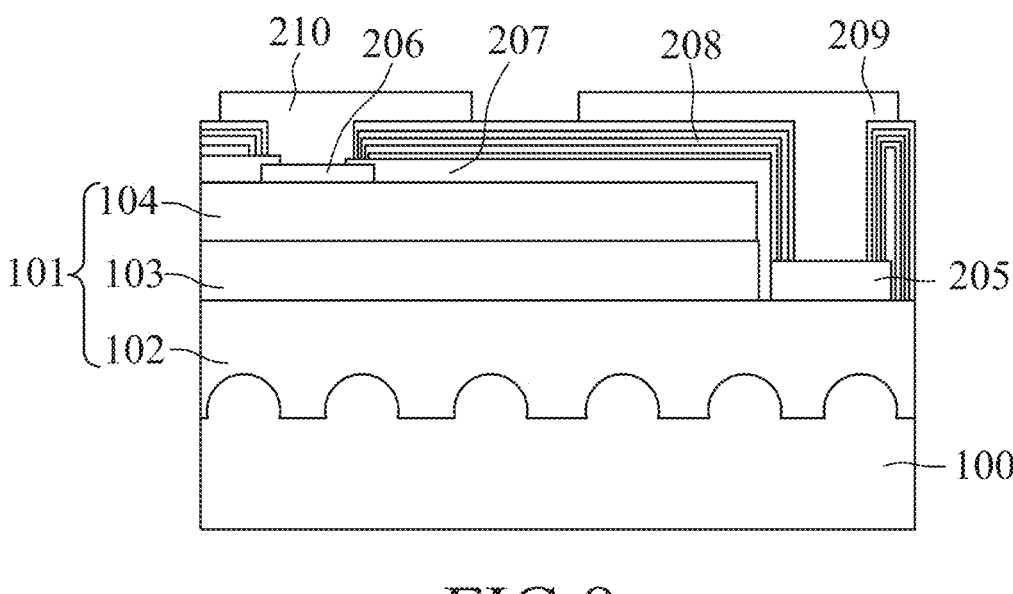
FIG. 8 is a schematic view illustrating a second embodiment of the light-emitting device according to the disclosure.

Referring to FIG. 8, a second embodiment of the light-emitting device according to the present disclosure is generally similar to the first embodiment, except that in the second embodiment, the light-emitting device is a flip-chip light-emitting diode, and the DBR structure 208 is disposed on one side of the semiconductor light-emitting stack 101 facing away the light-transmissive substrate 100 and the light-transmissive substrate 100 is disposed on the other side of the semiconductor light-emitting stack 101 facing away the DBR structure 208. In this embodiment, the main light exiting surface of the light-emitting device is located on a side of the light-transmissive substrate 100 that is distal from the semiconductor light-emitting stack 101, so that the DBR structure 208 reflects light emitted from the light-emitting layer 103 to the side of the light-transmissive substrate 100 that is distal from the semiconductor light-emitting stack 101. The semiconductor light-emitting stack 101 is disposed between the light-transmissive substrate 100 and the DBR structure 208.

In this embodiment, the light-emitting device includes a first metal electrode 205, a second metal electrode 206, a first electrode pad 209 and a second electrode pad 210. The first metal electrode 205 is disposed on the exposed part of the upper surface of the first conductivity type semiconductor layer 102 to be electrically connected to the first conductivity type semiconductor layer 102. The second metal electrode 206 is disposed on an upper surface of the second conductivity type semiconductor layer 104 to be electrically connected to the second conductivity type semiconductor layer 104. The first electrode pad 209 and the second electrode pad 210 are disposed on a side of the DBR structure 208 that is distal from the semiconductor light-emitting stack 101. The DBR structure 208 further has two openings. The first and second electrode pads 209, 210 are respectively connected to the first and second metal electrodes 205, 206 through the openings.

In this embodiment, the light-emitting device may further include a current spreading layer or a current blocking layer, so as to improve current spreading in the light-emitting device.

In this embodiment, the DBR structure 208 includes a first layer 207 that is nearest to the semiconductor light-emitting stack 101. The first layer 207 may be a first dielectric material layer having a relatively low refractive index. The first layer 207 may be formed by plasma enhanced chemical vapor deposition (PECVD). Compared with a first layer of a DBR structure formed by an ion beam assisted deposition process, the first layer 207 formed by PECVD is denser, and is capable of protecting surfaces and sidewalls of the semiconductor light-emitting stack 101 from being damaged by the physical vapor deposition process conducted for forming other layers of the DBR structure 208. The first layer 207 may be, for example, but not limited to, a silicon oxide layer.

In some embodiments, the DBR structure 208 may further include a second layer adjacent to the first layer 207. The second layer may be a second dielectric material layer. In other embodiments, the first layer 207 may be formed by PECVD to obtain a first thickness, followed by obtaining a second thickness through the ion beam assisted deposition, and the first layer 207 formed by PECVD is denser than that formed by the ion beam assisted deposition. The first and second thickness parts of the first layer 207 can not be discerned using a scanning electron microscope (SEM) or a transmission electron microscope (TEM). That is to say, there is no obvious difference in morphology between the first layer 207 having the first and second thickness parts and the first layer 207 formed entirely by PECVD.

By having the DBR structure 208, the luminous efficiency of the light-emitting device can be efficiently enhanced.

Figure 9:
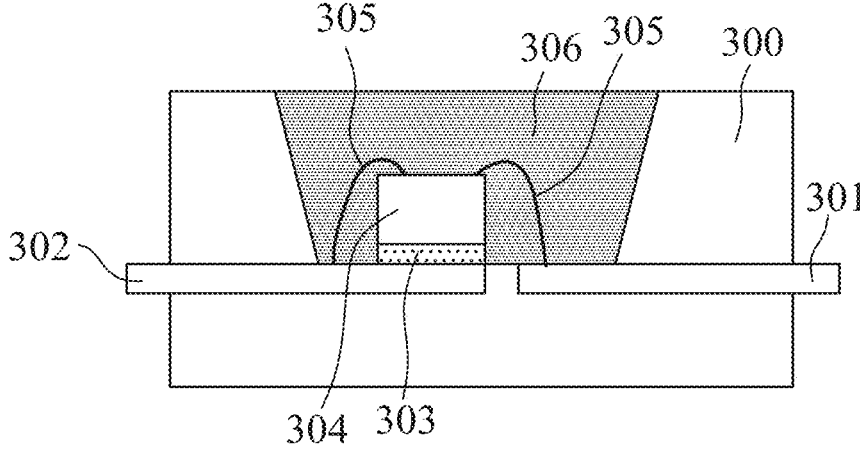
FIG. 9 is a schematic view illustrating a light-emitting apparatus according to the disclosure.

Referring to FIG. 9, this disclosure also provides a light-emitting apparatus that includes a package frame 300, a die-bonding glue 303, a light emitting device 304, two electrode wires 305, and an encapsulant 306. The package frame 300 may be made of one of a plastic material and a ceramic material. The package frame 300 includes a first package electrode 301 and a second package electrode 302 that are spaced apart from each other. The light emitting device 304 is the lateral-type light-emitting device of FIG. 1, and is fixed on the second package electrode 302 through the die-bonding glue 303. The first and second electrodes of the light emitting device 304 are electrically connected to the first and second package electrodes 301, 302 through the electrode wires 305, respectively. The light-emitting apparatus can emit blue light or mixed color light (e.g., white light). For example, the light-emitting apparatus can emit blue light having a peak wavelength of 450 nm. The encapsulant 306 is light-transmissive, is disposed on and used to protect the light emitting device 304, and to allow blue light to pass therethrough. The encapsulant 306 may include, for example, but not limited to, silicone. In order to emit white light, the light-emitting apparatus may further include a fluorescent conversion material capable of converting wavelength of light emitted from the light emitting device 304. The fluorescent conversion material may be disposed in the encapsulant 306. The encapsulant 306 may be glued to at least one side of the light emitting device 304 by using a glue dispenser or an adhesive tape. The fluorescent conversion material may include, for example, but not limited to, a combination of red and green phosphors, a yellow phosphor, or a combination of red, yellow and green phosphors.

With the provision that the second refractive index of the second dielectric material layer is greater than that of the first dielectric material layer, and the optical thickness of the second dielectric material layer is smaller than that of the first dielectric material layer, the light absorbance of the DBR structure 110, 208 can be significantly reduced. In addition, the DBR structure 110, 208 has a high reflectance with respect to light that is incident from the light-emitting layer 103 in a direction close to a right angle direction (i.e., a small incident angle light) or in a direction remote from the right angle direction (i.e., a large incident angle light), which can improve the luminous efficiency of the light-emitting device.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:
   a semiconductor light-emitting stack including a light-emitting layer; and
   a distributed Bragg reflector (DBR) structure disposed on said semiconductor light-emitting stack, said DBR structure including a plurality of first dielectric material layers, and a plurality of second dielectric material layers that are alternately stacked on said semiconductor light-emitting stack, each of said first dielectric material layers having a first refractive index, each of said second dielectric material layers having a second refractive index,
   wherein said first refractive index is lower than said second refractive index,
   wherein, with respect to each of said plurality of second dielectric material layers, said second dielectric material layer and a respective one of said plurality of first dielectric material layers that is adjacent to said second dielectric material layer are paired, and
   wherein in some consecutive pairs, an optical thickness of each of said second dielectric material layer is smaller than an optical thickness of said respective first dielectric material layer, and is not larger than 0.25λ.

2. The light-emitting device of claim 1, wherein an optical thickness of each of said second dielectric material layers is not smaller than 0.04λ, and said optical thickness of each of at least two of said second dielectric material layers is smaller than 0.25λ.

3. The light-emitting device of claim 1, wherein an optical thickness of each of said first dielectric material layers is not smaller than 0.25λ.

4. The light-emitting device of claim 1, wherein an optical thickness of each of said first dielectric material layers is not larger than 3λ, and said optical thickness of each of at least two of said first dielectric material layers is greater than 0.25λ.

5. The light-emitting device of claim 1, wherein an optical thickness of each of at least a half of the amount of said first dielectric material layers is greater than 0.25λ, and an optical thickness of each of at least a half of the amount of said second dielectric material layers is smaller than 0.25λ.

6. The light-emitting device of claim 1, wherein an optical thickness of each of said first dielectric material layers is greater than 0.25λ, and an optical thickness of each of said second dielectric material layers is smaller than 0.25λ.

7. The light-emitting device of claim 1, wherein an overall standard deviation value of an optical thickness of each of said first dielectric material layers is greater than that of an optical thickness of each of said second dielectric material layers.

8. The light-emitting device of claim 1, wherein said semiconductor light-emitting stack emits light having a peak wavelength within a range of from 380 nm to 480 nm, said DBR structure including a first region and a second region that is more distal from said semiconductor light-emitting stack than said first region, an average optical thickness of said first dielectric material layers located in said first region being greater than that of said first dielectric material layers located in said second region.

9. The light-emitting device of claim 8, wherein an optical thickness of each of said first dielectric material layers located in said first region ranges from 0.4λ to λ.

10. The light-emitting device of claim 8, wherein an optical thickness of each of said first dielectric material layers located in said second region ranges from 0.25λ to λ.

11. The light-emitting device of claim 1, wherein said semiconductor light-emitting stack emits light having a peak wavelength within a range of from 490 nm to 550 nm, an optical thickness of each of said second dielectric material layers ranging from 0.04λ to 0.25λ.

12. The light-emitting device of claim 1, wherein each of said first dielectric material layers is made of silicon oxide and each of said second dielectric material layers is made of titanium oxide.

13. The light-emitting device of claim 1, wherein said semiconductor light-emitting stack emits light having a peak wavelength within a range of from 380 nm to 550 nm.

14. The light-emitting device of claim 1, further comprising a light-transmissive substrate disposed between said semiconductor light-emitting stack and said DBR structure.

15. The light-emitting device of claim 14, wherein one of said first dielectric material layers is located proximate to said light-transmissive substrate, and an optical thickness of said one of said first dielectric material layers is greater than that of each of said second dielectric material layers and the other ones of said first dielectric material layers.

16. The light-emitting device of claim 1, further comprising a light-transmissive substrate disposed on a side of said semiconductor light-emitting stack facing away said DBR structure.

17. The light-emitting device of claim 16, wherein one of said first dielectric material layers of said DBR structure is located proximate to said semiconductor light-emitting stack, and an optical thickness of said one of said first dielectric material layers is greater than that of each of said second dielectric material layers and the other ones of said first dielectric material layers.

18. A light-emitting apparatus, comprising the light-emitting device as claimed in claim 1.

19. The light-emitting apparatus of claim 18, further comprising an encapsulant disposed on said light-emitting device and including a fluorescent conversion material.

20. The light-emitting device of claim 1, wherein in each pair, an optical thickness of said second dielectric material layer is smaller than an optical thickness of said respective first dielectric material layer.

* * * * *